US008492742B2

(12) United States Patent
Tamai

(10) Patent No.: US 8,492,742 B2
(45) Date of Patent: Jul. 23, 2013

(54) VARIABLE RESISTIVE ELEMENT, METHOD FOR PRODUCING THE SAME, AND NONVOLATILE SEMICONDUCTOR MEMORY DEVICE INCLUDING THE VARIABLE RESISTIVE ELEMENT

(75) Inventor: Yukio Tamai, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/396,851

(22) Filed: Feb. 15, 2012

(65) Prior Publication Data
US 2012/0223284 A1 Sep. 6, 2012

(30) Foreign Application Priority Data

Mar. 4, 2011 (JP) ................................. 2011-047236

(51) Int. Cl.
*H01L 21/8239* (2006.01)

(52) U.S. Cl.
USPC ............................................. 257/4; 438/382

(58) Field of Classification Search
USPC .................................................. 257/4; 438/3
See application file for complete search history.

(56) References Cited

U.S. PATENT DOCUMENTS

| | | | | |
|---|---|---|---|---|
| 5,792,569 | A * | 8/1998 | Sun et al. ........................ | 428/815 |
| 6,204,139 | B1 | 3/2001 | Liu et al. | |
| 7,208,372 | B2 * | 4/2007 | Hsu et al. ...................... | 438/257 |
| 7,981,760 | B2 * | 7/2011 | Kawashima et al. ......... | 438/385 |
| 8,008,096 | B2 * | 8/2011 | Fuchigami et al. ............... | 438/3 |
| 8,058,095 | B2 * | 11/2011 | Liu ................................. | 438/95 |
| 2010/0172170 | A1 | 7/2010 | Tamai et al. | |
| 2011/0193050 | A1 | 8/2011 | Takano et al. | |

FOREIGN PATENT DOCUMENTS

JP 2011-165883 A 8/2011

OTHER PUBLICATIONS

Liu et al., "Electric-pulse-induced reversible Resistance change effect in magnetoresistive films", *Applied Physics Letter*, vol. 76, 2000, pp. 2749-2751.
Pagnia et al., "Bistable Switching in Electroformed Metal-Insulator-Metal Devices", *Phys. Stat. Sol.*, (a), vol. 108, 1988, pp. 11-65.
Baek et al., "Highly Scalable Non-Volatile Resistive Memory Using Simple Binary Oxide Driven by Asymmetric Unipolar Voltage Pulses", *IEDM 04*, 2004, pp. 587-590.

* cited by examiner

*Primary Examiner* — Thao Le
(74) *Attorney, Agent, or Firm* — Nixon & Vanderhye, P.C.

(57) ABSTRACT

A variable resistive element configured to reduce a forming voltage while reducing a variation in forming voltage among elements, a method for producing it, and a highly integrated nonvolatile semiconductor memory device provided with the variable resistive element are provided. The variable resistive element includes a resistance change layer (first metal oxide film) and a control layer (second metal oxide film) having contact with a first electrode sandwiched between the first electrode and a second electrode. The control layer includes a metal oxide film having a low work function (4.5 eV or less) and capable of extracting oxygen from the resistance change layer. The first electrode includes a metal having a low work function similar to the above metal, and a material having oxide formation free energy higher than that of an element included in the control layer, to prevent oxygen from being thermally diffused from the control layer.

13 Claims, 14 Drawing Sheets

| Oxide | Oxide formation free energy [kJ/mol/O2] | Element | Work function [eV] |
|---|---|---|---|
| HfO2 | −1014.028 | Hf | 3.9 |
| Al2O3 | −970.774 | Al | 4.2 |
| ZrO2 | −966.110 | Zr | 4.1 |
| TiO2(Anatase) | −811.036 | Ti | 4.3 |
| TiO2(Rutile) | −816.074 | | |
| Ta2O5 | −693.293 | Ta | 4.3 |
| Nb2O5 | −635.797 | Nb | 4.3 |
| V2O5 | −498.498 | V | 4.3 |
| WO3 | −440.12 | W | 4.5 |
| SiO2 | −783.79 | | |
| MoO3 | −377.739 | | |

Fig. 2

VARIABLE RESISTIVE ELEMENT, METHOD FOR PRODUCING THE SAME, AND NONVOLATILE SEMICONDUCTOR MEMORY DEVICE INCLUDING THE VARIABLE RESISTIVE ELEMENT

CROSS REFERENCE TO RELATED APPLICATION

This Nonprovisional application claims priority under 35 U.S.C. §119(a) on Patent Application No. 2011-047236 filed in Japan on Mar. 4, 2011 the entire contents of which are hereby incorporated by reference.

BACKGROUND OF THE INVENTION

1. Field of the Invention

The present invention relates to a nonvolatile variable resistive element including a first electrode, a second electrode, and a layer serving as a variable resistor formed of a metal oxide and sandwiched between the above electrodes, and a nonvolatile semiconductor memory device using the variable resistive element for storing information.

2. Description of the Related Art

Recently, as a high-speed operable next-generation nonvolatile random access memory (NVRAM) to replace a flash memory, various device structures such as FeRAM (Ferroelectric RAM), MRAM (Magnetic RAM), and PRAM (Phase Change RAM) have been proposed, and they face intense development competition with a view to improving performance, increasing reliability, lowering cost, and ensuring consistency with processes.

With respect to these existing techniques, RRAM (Resistive Random Access Memory) which is a nonvolatile resistive memory using a variable resistive element whose electric resistance is changed reversibly by applying a voltage pulse has been proposed. FIG. 12 shows this configuration.

As shown in FIG. 12, a conventional variable resistive element has a structure in which a lower electrode 103, a variable resistor 102, and an upper electrode 101 are laminated in this order, and it is characterized in that when a voltage pulse is applied between the upper electrode 101 and the lower electrode 103, its resistance value can be reversibly changed. A new nonvolatile semiconductor memory device can be realized by reading a resistance value which is changed by this reversible resistance changing action (hereinafter, referred to as the "switching action").

The nonvolatile semiconductor memory device is composed by forming a memory cell array in which memory cells each including a variable resistive element are arranged in a shape of matrix in a row direction and a column direction, and by arranging periphery circuits to control programming, erasing, and reading actions of data for each memory cell of the memory cell array. Thus, as for the memory cell, there are a memory cell in which one memory cell includes one selection transistor T and one variable resistive element R (referred to as the "1T1R type") and a memory cell in which one memory cell only includes one variable resistive element R (referred to as the "1R type"), depending on a difference in composed component. Among them, FIG. 13 shows a configuration example of the 1T1R type memory cell.

FIG. 13 is an equivalent circuit diagram showing one configuration example of the memory cell array having the 1T1R type memory cells. A gate of the selection transistor T in each memory cell is connected to a word line (WL1 to WLn), and a source of the selection transistor T in each memory cell is connected to a source line (SL1 to SLn) (n is a natural number). In addition, one electrode of the variable resistive element R in each memory cell is connected to a drain of the selection transistor T, and the other electrode of the variable resistive element R is connected to the bit line (BL1 to BLm) (m is a natural number). In addition, the word lines WL1 to WLn are connected to a word line decoder 106, and the source lines SL1 to SLn are connected to a source line decoder 107, and the bit lines BL1 to BLm are connected to a bit line decoder 105. Thus, in response to an address input (not shown), the specific bit line, word line, and source line are selected for programming, erasing, and reading actions for the specific memory cell in a memory cell array 104.

Thus, according to the configuration in which the selection transistor T and the variable resistive element R are arranged in series, the transistor of the memory cell selected by a potential change of the word line is turned on, and programming or erasing can be selectively performed only for the variable resistive element R of the memory cell selected by a potential change of the bit line.

FIG. 14 is an equivalent circuit diagram showing one configuration example of the 1R type memory cell. Each memory cell includes the variable resistive element R only, and one electrode of the variable resistive element R is connected to the word line (WL1 to WLn), and the other electrode thereof is connected to the bit line (BL1 to BLm). In addition, the word lines WL1 to WLn are connected to the word line decoder 106, and the bit lines BL1 to BLm are connected to the bit line decoder 105. Thus, in response to the address input (not shown), the specific bit line, and word line are selected for programming, erasing, and reading actions for the specific memory cell in a memory cell array 108.

As for the above variable resistive element R, a method for reversibly changing electric resistance by applying a voltage pulse to a perovskite material known for a supergiant magnetoresistance effect, as the variable resistance material used in the variable resistor is disclosed in U.S. Patent Publication No. 6,204,139 (hereinafter, referred to as the "well-known document 1") by Shangquing Liu or Alex Ignatiev at Houston University in the United States, and in "Electric-pulse-induced reversible Resistance change effect in magnetoresistive films", Applied Physics Letter, Vol. 76, pp. 2749-2751, in 2000 by Liu, S. Q. et al. By this method, the several-digit resistance change appears in room temperature without applying an magnetic field even when the perovskite material known for the supergiant magnetoresistance effect is used. In addition, according to an element structure illustrated in the well-known document 1, as the material of the variable resistor, praseodymium calcium manganese oxide $Pr_{1-x}Ca_xMnO_3$ (PCMO) film which is a perovskite type oxide is used.

In addition, as another variable resistor material, an oxide of a transition metal element such as a titanium oxide ($TiO_2$) film, nickel oxide (NiO) film, zinc oxide (ZnO) film, or niobium oxide ($Nb_2O_5$) film shows the reversible resistance change as shown in "Bistable Switching in Electroformed Metal-Insulator-Metal Devices", Phys. Stat. Sol. (a), vol. 108, pp. 11-65, in 1988 by H. Pagnia et al., and in "Highly Scalable Non-volatile Resistive Memory using Simple Binary Oxide Driven by Asymmetric Unipolar Voltage Pulses", IEDM 04, pp. 587-590, in 2004 by Baek, I. G. et al (hereinafter referred to as the "well-known document 2").

In addition, the above-described variable resistive element shows an n-type or p-type conductivity of a semiconductor because an impurity level is formed in a bandgap by an oxygen defect in the metal oxide. In addition, it is confirmed that the resistance change is a state change in the vicinity of an electrode interface.

As for the variable resistive element using the transition metal oxide for the variable resistor, it is necessary to perform a soft breakdown process, referred to as a forming process to enable resistance switching to be realized. A voltage (forming voltage) required for the soft breakdown process is higher than a programming voltage for recording information. Meanwhile, since it is necessary to drive the variable resistive element with a fine transistor in realizing a highly integrated nonvolatile memory, the forming voltage has to be lowered.

Here, it is known that the forming voltage is roughly proportional to a film thickness of the metal oxide used for the variable resistor, and a method for lowering the forming voltage most easily is to thin the film thickness of the metal oxide as disclosed in the well-known document 2.

However, when the film thickness of the metal oxide becomes thin, a variation in characteristics could be generated due to slight fluctuation of a film forming process or surface roughness of a base substrate.

SUMMARY OF THE INVENTION

In view of the above problems in the conventional technique, it is an object of the present invention to provide a variable resistive element having configuration such that low voltage can be realized while a variation of a forming voltage among elements is reduced, and a method for producing it.

It is another object of the present invention to provide a highly integrated nonvolatile semiconductor memory device that has the above variable resistive element and is easy to produce.

A variable resistive element according to the present invention to attain the above object is a variable resistive element having a first metal oxide film which is an oxide film of a first metal and sandwiched between a first electrode and a second electrode, in which through a forming process, a resistance state between the first and second electrodes of the variable resistive element is changed from an initial high resistance state before the forming process to a variable resistance state, the resistance state in the variable resistance state is changed between two or more different resistance states by applying an electric stress between the first electrode and the second electrode of the variable resistive element in the variable resistance state, and one resistance state after the change is used for storing information, a control layer containing oxygen is inserted between the first electrode and the first metal oxide film, and formed of a second metal capable of extracting oxygen from the first metal oxide film to prevent oxygen from being thermally diffused from the first metal oxide film to the first electrode, the second metal included in the control layer is different from the first metal, or same as the first metal, when the second metal is same as the first metal, a concentration distribution is provided in such a manner that an oxygen concentration of the control layer and the first metal oxide film becomes lower from the first metal oxide film toward the control layer across a boundary between the first metal oxide film and the control layer, oxide formation free energy of at least one element included in the control layer except for oxygen is lower than oxide formation free energy of an element included in the first electrode, and both work functions of the second metal and the first electrode are 4.5 eV or less.

As for the variable resistive element according to the present invention having the above characteristics, it is preferable that a concentration distribution is provided in such a manner that an oxygen concentration of the control layer becomes lower from the side of the first metal oxide film toward the side of the first electrode.

As for the variable resistive element according to the present invention having the above characteristics, it is preferable that a concentration distribution is provided in such a manner that an oxygen concentration of the first metal oxide film becomes lower from the side of the second electrode toward the side of the control layer.

As for the variable resistive element according the present invention having the above characteristics, it is preferable that the first metal oxide film comprises an n-type metal oxide.

As for the variable resistive element according to the present invention having the above characteristics, it is preferable that the first metal oxide film comprises an oxide of any one of elements of Hf, Zr, Ti, Ta, V, Nb, and W, or a strontium titanate.

As for the variable resistive element according to the present invention having the above characteristics, it is preferable that the second metal comprises any one of elements of Ti, V, Al, Hf, and Zr.

As for the variable resistive element according to the present invention having the above characteristics, it is preferable that a work function of the second electrode is 4.5 eV or more.

As for the variable resistive element according to the present invention having the above characteristics, it is preferable that the control layer is thinner than the first electrode.

As for the variable resistive element according to the present invention having the above characteristics, it is preferable that a film thickness of the control layer is 20 nm or less.

A method for producing the variable resistive element according to the present invention to attain the above object is a method for producing the variable resistive element according to the present invention having the above characteristics, and it has the steps of;

depositing a second electrode material on a substrate, and forming the second electrode;

depositing a first metal oxide film material, a second metal material, and a first electrode material in this order;

forming the first metal oxide film and the first electrode by patterning the first metal oxide film material, the second metal material, and the first electrode material with a common resist mask;

performing a heat treatment; and applying a forming voltage between the first electrode and the second electrode to perform a forming process, whereby oxygen in the first metal oxide film being partially moved toward the second metal material, the second metal material being changed into the control layer, a resistance state of the variable resistive element being changed from the initial high resistance state to the variable resistance state.

A nonvolatile semiconductor memory device according to the present invention to attain the above object includes a memory cell array having the variable resistive elements according to the present invention having the above characteristics, the variable resistive elements being arranged in at least a column direction of a row direction and the column direction.

As for the nonvolatile semiconductor memory device according to the present invention having the above characteristics, it is preferable that the memory cell array is provided in such a manner that the first electrode extends in the column direction to connect the variable resistive elements adjacent in the column direction, and the control layer extends in the column direction.

A dedicated study by the inventors of this application has found that in the variable resistive element having the metal oxide film (variable resistor) sandwiched between the first electrode and the second electrode, the forming voltage can be reduced when the control layer formed of the metal film containing oxygen is provided between the first electrode and the metal oxide film, and the control layer extracts oxygen from the metal oxide film.

Thus, since the forming voltage can be reduced without depending only on thinning the metal oxide, it is not necessary to extremely thin the film thickness of the metal oxide, and a margin is allowed for the control of the film forming process. In addition, the forming voltage can be stably lowered even for a heat history experienced in a semiconductor process by controlling a thickness of the control layer, and laminating thereon an electrode whose reactivity with oxygen is lower than that of the control layer.

Therefore, according to the present invention, the forming voltage can be lowered while a variation in forming voltage between the elements is reduced, and the variable resistive element can be driven at a low voltage, in actions including a forming process. As a result, the variable resistive element can be easily driven with a fine transistor having a low withstand voltage, and the highly integrated nonvolatile semiconductor memory device having the variable resistive element can be easily realized.

BRIEF DESCRIPTION OF THE DRAWINGS

FIG. 2 is a table showing oxide formation free energy and a work function value of a metal.

DESCRIPTION OF THE PREFERRED EMBODIMENT

First Embodiment

Figure 1:
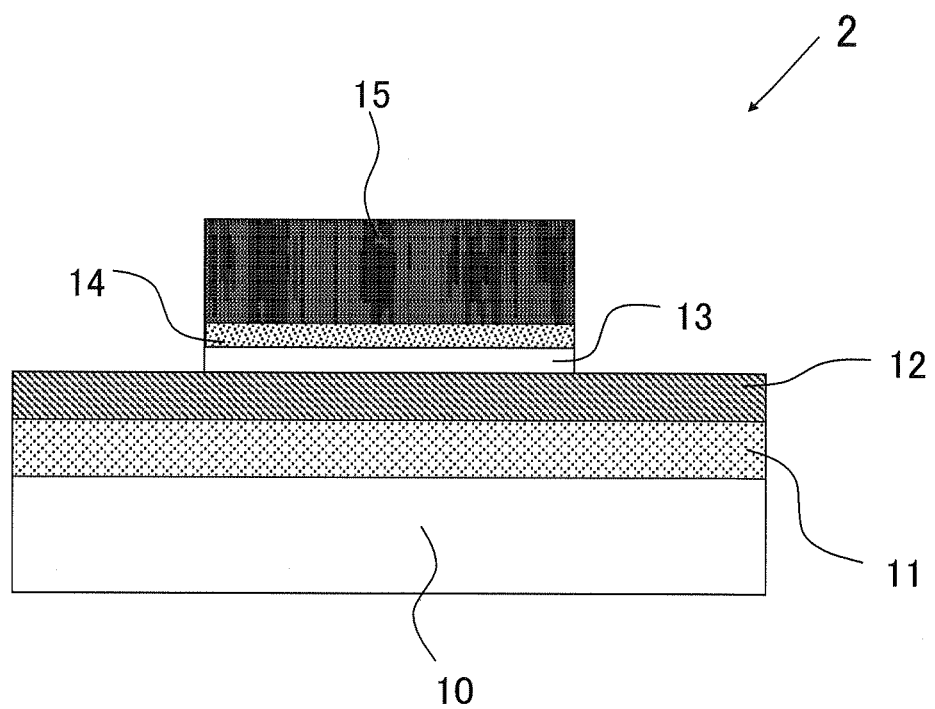
FIG. 1 is a cross-sectional schematic view showing one example of a structure of a variable resistive element according to the present invention.

FIG. 1 is a cross-sectional view schematically showing an element structure of a variable resistive element 2 used in a nonvolatile semiconductor memory device according to one embodiment of the present invention (hereinafter, referred to as the "device 1 of the present invention" occasionally). In addition, in the following drawings, an essential part is emphasized for descriptive convenience and a dimensional ratio of each part of the element does not always coincide with an actual dimensional ratio.

According to this embodiment, a hafnium oxide ($HfO_X$) which serves as an insulator layer having a wide bandgap is used for a resistance change layer (variable resistor). However, the present invention is not limited to this configuration. The resistance change layer may include a zirconium oxide ($ZrO_X$), titanium oxide ($TiO_X$), tantalum oxide ($TaO_X$), vanadium oxide ($VO_X$), niobium oxide ($NbO_X$), tungsten oxide ($WO_X$), or strontium titanate ($SrTiO_X$). In addition, these are all an n-type metal oxide.

In addition, in the case where these transition metal oxides are used for the resistance change layer, initial resistance of the variable resistive element just after produced is very high, so that in order to put it into a state in which a high resistance state and a low resistance state can be switched by an electric stress, it is necessary to perform what we call a forming process in which a voltage pulse which is large in voltage amplitude and long in pulse width compared to a voltage pulse used in a normal writing action is applied to the variable resistive element in the initial state just after produced, and a current path is formed to cause resistance switching before used. It is known that the current path (referred to as a filament path) formed by this forming process determines electric characteristics of the element thereafter.

The variable resistive element 2 is formed such that a second electrode 12, a first metal oxide film 13 which serves as a resistance change layer and an oxide film of a first metal, a control layer 14 which is a metal film containing oxygen, and a first electrode 15 are deposited and patterned in this order on an insulation film 11 formed on a substrate 10. Here, the variable resistive element 2 is configured such that a Shottky interface is formed at an interface between the second electrode 12 and the resistance change layer (first metal oxide film) 13, and an electron state in the vicinity of the interface is reversibly changed by applying the electric stress and as a result, the resistance is changed.

The control layer 14 has an ability to extract oxygen from the resistance change layer 13, and contains oxygen in a second metal whose work function is smaller than that of the second electrode 12 so that the resistance switching can be stably caused at the interface between the second electrode 12 and the resistance change layer 13. In addition, the control layer 14 may be an oxide film of the second metal (second metal oxide film), or a film of the second metal whose oxygen concentration is not as high as the oxide, but which contains a lot of oxygen as an impurity. The resistance change layer 13 and the control layer 14 have concentration distributions in which an oxygen concentration decreases from a side of the second electrode 12 to a side of the control layer 14 in the resistance change layer 13, and from a side of the resistance change layer 13 to a side of the first electrode 15 in the control layer 14. According to this embodiment, the control layer 14 is configured such that the second metal film having the ability to extract oxygen is in contact with the resistance change layer 13, and oxygen in the resistance change layer (first metal oxide film) 13 is partially moved toward the metal film by application of heat and a forming voltage. More specifically, materials of the control layer 14 and the second electrode 12 are selected so that the work function of the second metal is 4.5 eV or less, and the work function of the second electrode 12 is 4.5 eV or more.

Here, the material of the second metal which can be used for the control layer 14 and likely to extract oxygen includes Ti (4.3 eV), V (4.3 eV), Al (4.2 eV), Hf (3.9 eV), or Zr (4.1 eV). In addition, the material of the second electrode includes a titanium nitride (TiN: 4.7 eV) or titanium oxynitride, or as a material which is relatively high in work function and used often in an LSI production process, tantalum nitride (TaNx: 4.05 to 5.4 eV depending on a stoichiometric composition x of nitride), tantalum oxynitride, titanium aluminum nitride, W (4.5 eV), or Ni (5.2 eV). In addition, a work function value of each metal is shown in parentheses.

Furthermore, a film thickness of the control layer 14 is set to a predetermined film thickness or less (preferably, equal to or less than a film thickness of the first electrode 15 and in the case of this embodiment where TiOx is used for the control layer, more preferably equal to or less than 20 nm) so that oxygen is not excessively extracted from the resistance change layer 13. Here, when the control layer 14 is thin, the electron state at the interface between the resistance change layer 13 and the control layer 14 is affected by the first electrode 15. In this case also, a work function of the first electrode 15 is set to be the same level as the work function of the second metal so as to realize stable resistance switching at the interface between the second electrode 12 and the resistance change layer 13. That is, a material of the first electrode is selected so that the work function of the first electrode 15 is also 4.5 eV or less. In addition, the first electrode 15 is formed of a material having an oxygen extracting ability smaller than that of the control layer 14 so that the control layer 14 dominates the oxygen extraction.

Therefore, the material of the first electrode 15 is preferably selected from materials having oxide formation free energy higher than oxide formation free energy of at least one element included in the control layer 14 except for oxygen. In addition, the oxide formation free energy of the first electrode 15 is preferably higher than the oxide generation free energy of at least one element of the control layer 14 except for oxygen by 100 kJ/mol or more per 1 mole of oxygen molecules. In this manner, oxygen is prevented from being thermally diffused from the control layer 14 to the first electrode 15.

FIG. 2 shows a value of the oxide formation free energy [kJ/mol] per 1 mole of oxygen molecules, and a work function value at 427° C. (700K) of an oxide of each of Ta, Ti, V, Al, W, Nb, Hf, and Zr, as the material which can be used for the first electrode 15. As shown in FIG. 2, the oxide formation energy decreases in the order of Hf, Al, Zr, Ti, Ta, Nb, V, and W. For example, when TiOx is used for the control layer 14, a material such as Ta, Nb, V, or W can be used for the first electrode material.

Hereinafter, a method for producing the variable resistive element 2 will be described. First, a silicon oxide film having a thickness of 200 nm is formed on a single crystal silicon substrate 10 as the insulation film 11 by a thermal oxidation method. Then, as the material of the second electrode 12, a titanium nitride film having a thickness of 100 nm is formed on the silicon oxide film 11 by a sputtering method.

Then, as the material of the resistance change layer (first metal oxide film) 13, a hafnium oxide film having a thickness of 3 to 5 nm (5 nm in this case) is formed on the titanium nitride film 12 by sputtering or ALD (Atomic Layer Deposition), and then as the second metal material which becomes the control layer 14, a titanium film having a thickness of 3 to 20 nm is formed by sputtering.

Then, as the material of the first electrode 15, a tantalum thin film having a thickness of 150 nm is formed on the control layer 14 by a sputtering method. Finally, a pattern is formed in a photoresist process, and the element region of 0.4 μm×0.4 μm is formed as shown in FIG. 1 by dry etching. Thus, the variable resistive element 2 is produced. After that, a heat treatment is performed, and when needed, an interlayer insulation film is formed and wiring is performed.

Then, the variable resistive element 2 is put into a variable resistance state in which the resistance can be changed, by applying the forming voltage between the first electrode and the second electrode.

At this time, oxygen in the resistance change layer 13 is partially moved to the titanium film at the time of the heat treatment and at the time of application of the forming voltage, and as a result, the titanium film is oxidized and becomes $TiO_X$, whereby the control layer 14 is formed.

Figure 3:
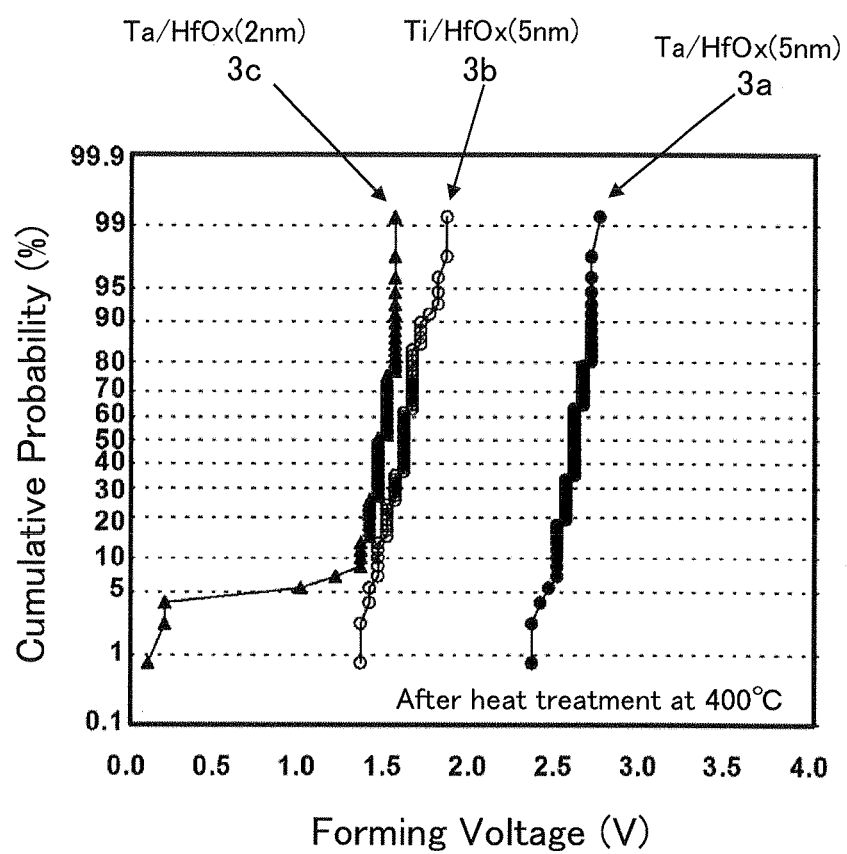
FIG. 3 is a view showing a cumulative probability distribution of a forming voltage in a conventional variable resistive element.

Hereinafter, a description will be made of the fact that the above configuration is effective to solve the problem. FIG. 3 shows a cumulative probability distribution of voltages after the forming process has been completed for 64 elements in a wafer surface, with respect to conventional variable resistive elements 3a to 3c produced by the method for producing the variable resistive element 2 except for the formation of the control layer 14. In addition, FIG. 3 shows a result provided after the elements 3a to 3b have been subjected to a heat treatment at 400° C. Furthermore, the experiment is carried out such that with a semiconductor parameter analyzer (4156C produced by Agilent Technologies), a voltage when a current amount exceeds a certain value has been measured while increasing the applied voltage from 0V to 5V by a step of 10 mV.

By making a comparison between the element 3a in which a HfOx having a film thickness of 5 nm is used for the resistance change layer 13, and Ta having a thickness of 100 nm is used for the first electrode 15, and the element 3b in which HfOx having a film thickness of 5 nm is also used for the resistance change layer, and Ti having a thickness of 100 nm is used as the first electrode instead of Ta, it is found that the forming voltage can be lowered in the case where the Ti electrode is used compared to the case where the Ta electrode is used. This is because Ti is likely to extract oxygen from the metal oxide compared to Ta.

Meanwhile, by making a comparison between the element 3a, and element 3c in which HfOx having a film thickness of 2 nm is used for the resistance change layer, and Ta having a thickness of 100 nm is used for the first electrode, it is found that when HfOx is thinned, the forming voltage can be reduced, but a defect in which a withstand voltage is extremely low is generated.

From the above, it is found that there is a limit on thinning the film thickness in order to lower the forming voltage, and to use the electrode which can easily extract oxygen is effective in lowering the forming voltage without generating an element having a defective withstand voltage.

Figure 4:
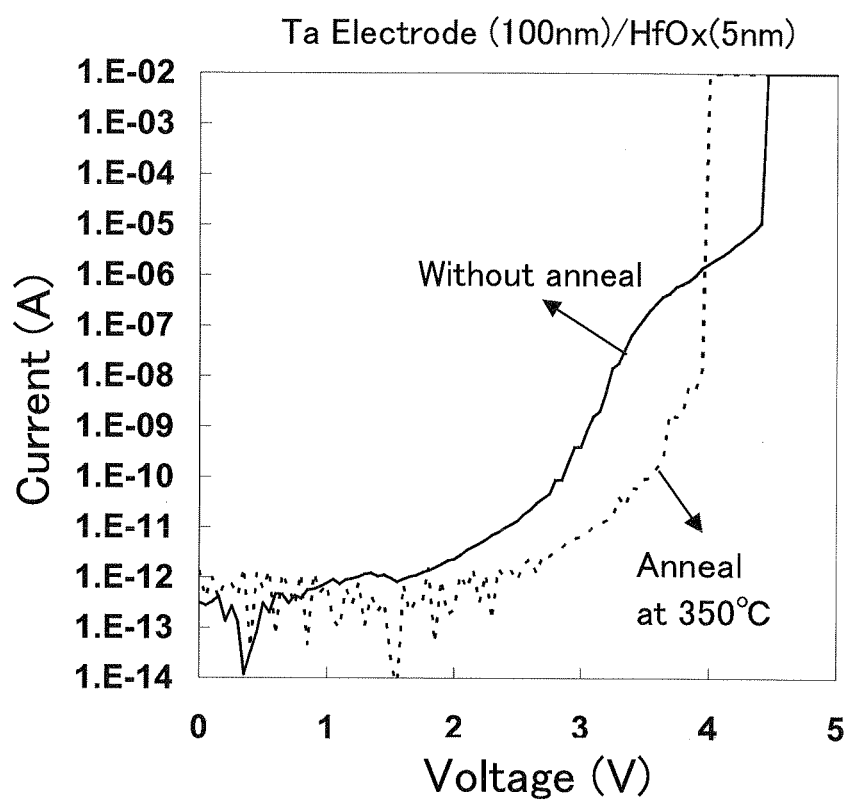
FIG. 4 is a view showing a variation of a current amount flowing in the variable resistive element with respect to a voltage applied to the variable resistive element at the time of measurement of the forming voltage.
Figure 5:
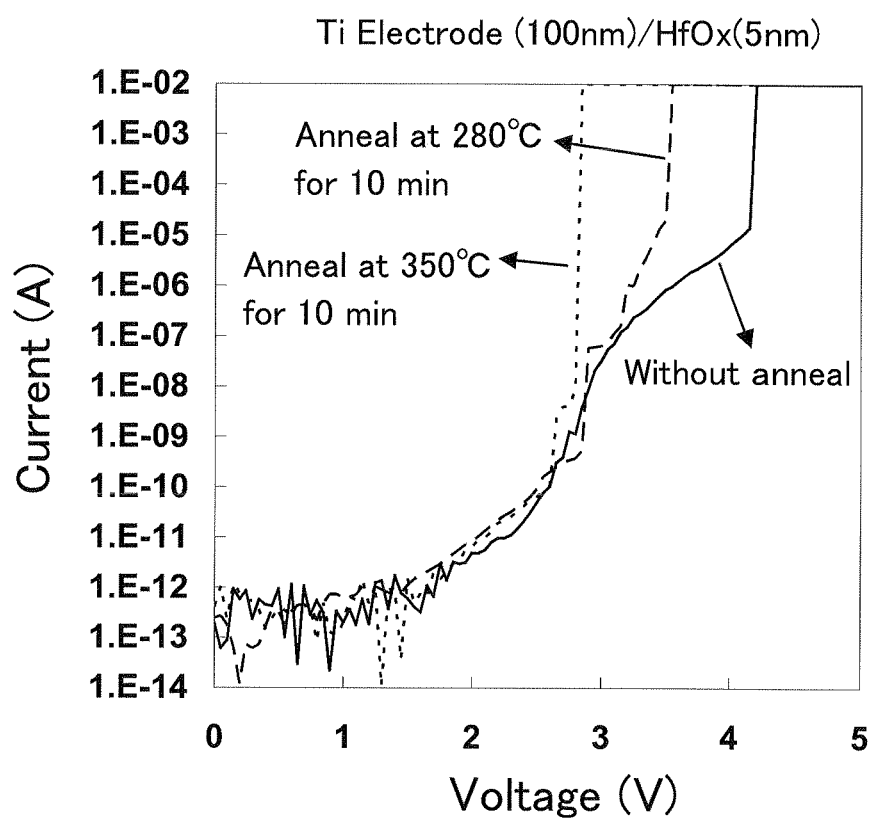
FIG. 5 is a view showing a variation of a current amount flowing in the variable resistive element with respect to a voltage applied to the variable resistive element at the time of measurement of the forming voltage.

FIGS. 4 and 5 are views each showing a variation of a current amount flowing in the variable resistive element with respect to the voltage applied to the variable resistive element while the forming voltage is measured, and shows how the forming voltage is changed due to a difference in heat treatment temperature. In addition, FIG. 4 shows the case of the element 3a in which Ta is used for the first electrode 15 in the element structure of the variable resistive element, and FIG. 5 shows the case of the element 3b in which Ti is used for the first electrode 15. In the drawing, a voltage when a current abruptly increases is a measurement value of the forming voltage.

From FIGS. 4 and 5, it is found that the forming voltage tends to decrease due to a heat history in the variable resistive element, but the forming voltage largely decreases in the element 3b using the Ti electrode (FIG. 5) compared to the element 3a using the Ta electrode (FIG. 4) even when the heat history is the same. In addition, FIG. 5 shows the result in the case where the heat treatment is performed up to 350° C., but when the element 3b is subjected to a heat treatment at 420° C., some variable resistive elements short out.

That is, the above experiment result shows that to use the electrode such as Ti which is likely to extract oxygen, is effective to reduce the forming voltage, but when the heat history of the general semiconductor process is imposed, the variable resistive element could short out in the case of the Ti electrode.

Figure 6:
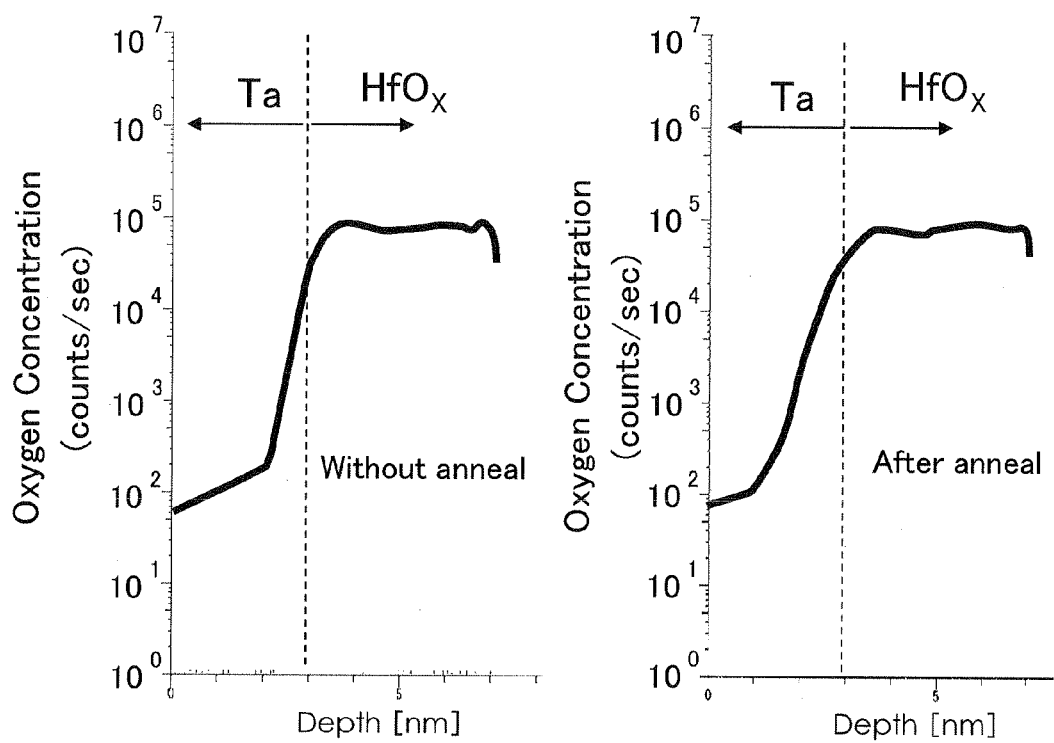
FIG. 6 is a view showing an oxygen concentration distribution in the vicinity of a boundary between a first electrode and a resistance change layer in a case where a heat treatment is performed and in a case where it is not performed, in a conventional variable resistive element using Ta for the first electrode.
Figure 7:
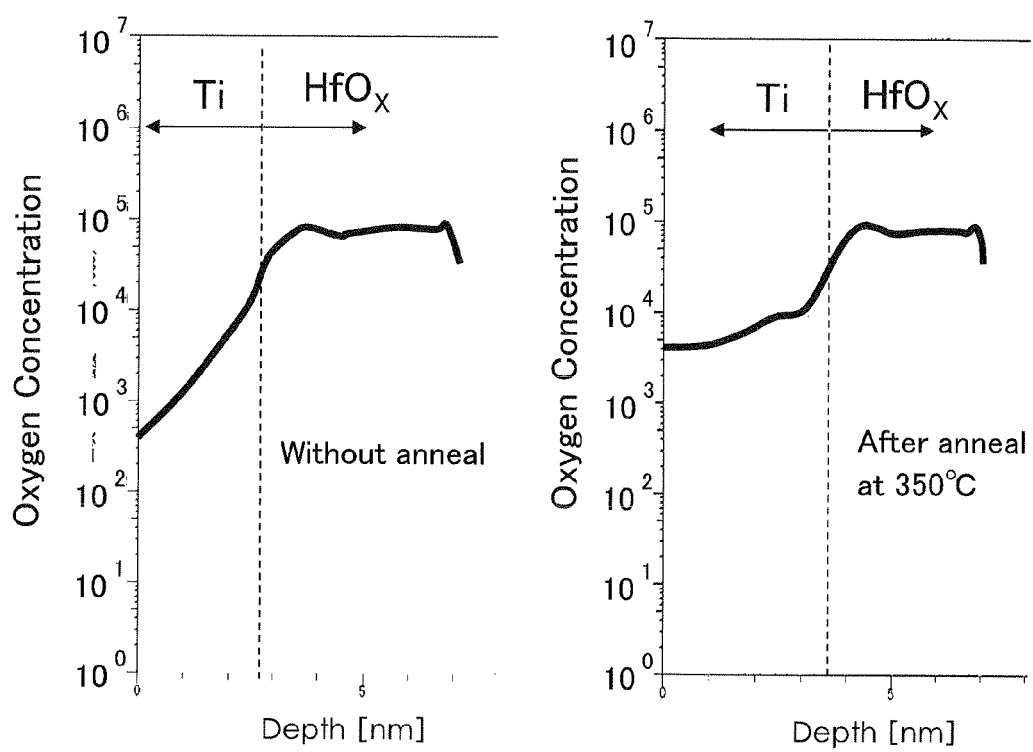
FIG. 7 is a view showing an oxygen concentration distribution in the vicinity of a boundary between the first electrode and the resistance change layer in a case where a heat treatment is performed and in a case where it is not performed, in a conventional variable resistive element using Ti for the first electrode.

FIGS. 6 and 7 show oxygen concentration distributions in the vicinity of the boundary between the first electrode and the resistance change layer measured by SIMS (Secondary-Ion Mass Spectroscopy) in the case where the element 3a and the element 3b have been subjected to the heat treatment and the case where they are not subjected thereto, respectively. As can be understood from FIGS. 6 and 7, it is found that oxygen is largely diffused toward the electrode in both cases where the heat treatment is performed and not performed in the element 3b using the Ti electrode (FIG. 7) compared to the case of the element 3a using the Ta electrode (FIG. 6). The oxygen concentration tends to decrease from HfOx toward the inside of the electrode in both of the elements 3a and 3b, but in the case of the element 3b using the Ti electrode (FIG. 7), oxygen enters the electrode deeply, while in the case of the element 3a using the Ta electrode (FIG. 6), both entered amount and entered depth are smaller than those of the element 3b.

Figure 8:
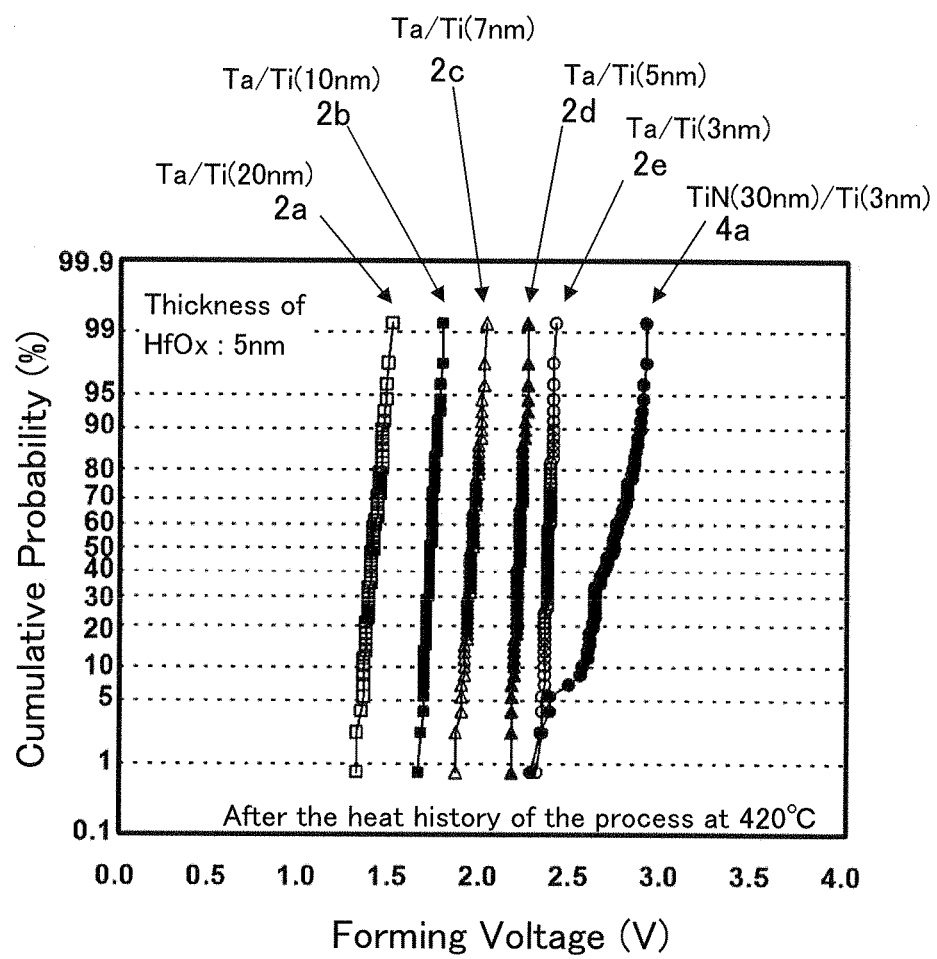
FIG. 8 is a view showing a cumulative probability distribution of the forming voltage in the variable resistive element according to the present invention.

Meanwhile, FIG. 8 shows a cumulative probability distribution of voltages after the forming process has been completed for 64 elements, with respect to variable resistive elements 2a to 2e of the present invention formed such that TiOx is formed as the control layer 14 on HfOx having a film thickness of 5 nm as the resistance change layer, according to the method for producing the variable resistive element 2. In addition, these elements have been subjected to a heat treatment at 420° C. (to 700K) as the heat history of the semiconductor process. It is found that in the case where Ta is used for the first electrode, as the TiOx of the control layer becomes thick, the forming voltage becomes low and can be reduced to 2V or less. Thus, these elements do not short out due to the heat treatment at 420° C. and show preferable resistance switching.

Meanwhile, in a case of an element 4a in which titanium nitride is used for the first electrode 15 and formed on the control layer 14 of TiOx having a thickness of 3 nm, its withstand voltage tends to increase. In addition, it does not show preferable resistance switching. It is considered that an influence by titanium nitride having the high work function appears as an effective electrode because the control layer 14 is thinned. That is, it shows that it is important to provide the first electrode 15 having the low work function on the control layer 14.

As described above, when the variable resistive element 2 is formed by laminating the first electrode 15 having the function to prevent oxygen from being thermally diffused and having the low work function, on the thin control layer 14, the variable resistive element can prevent oxygen from being thermally diffused from the control layer 14 toward the first electrode 15, suppress the forming voltage, and be stable to the heat history of the general semiconductor process.

Figure 9:
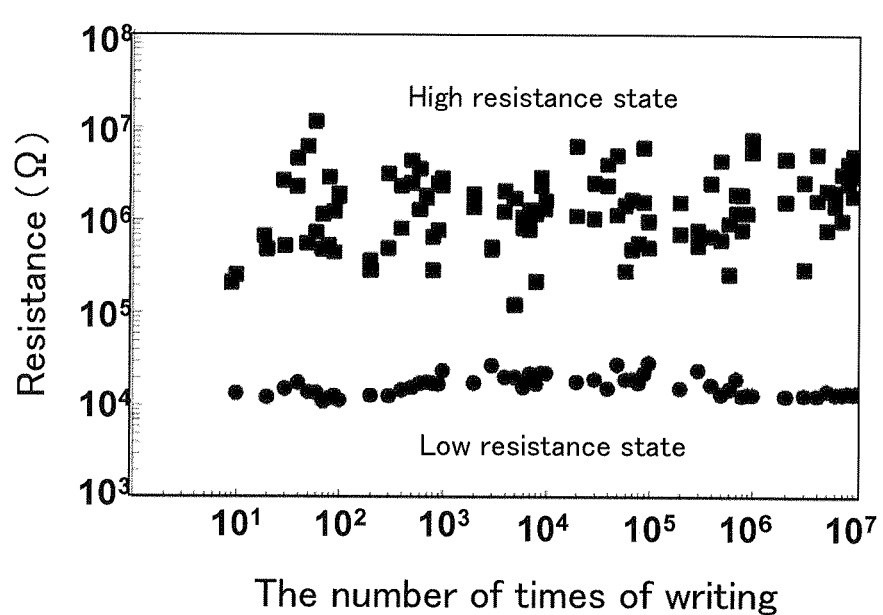
FIG. 9 is a view showing writing endurance characteristics of the variable resistive element according to the present invention.

FIG. 9 shows writing characteristics in a 1T-1R configuration in which the variable resistive element 2b using TiOx having a thickness 10 nm as the control layer 14 is connected to a MOSFET in series. It has been confirmed that stable writing can be performed until the number of times of writing is $10^7$ times.

Second Embodiment

Figure 10:
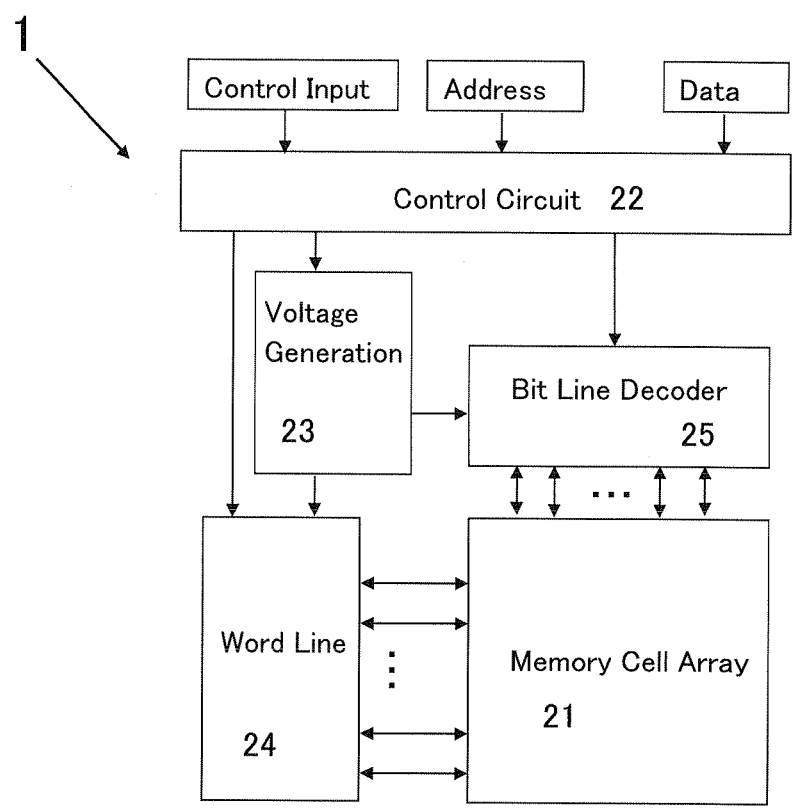
FIG. 10 is a circuit block diagram showing a schematic configuration of a nonvolatile semiconductor memory device according to the present invention.

FIG. 10 shows an example of the device 1 of the present invention having the above variable resistive element 2 (2a to 2e). FIG. 10 is a circuit block diagram showing a schematic configuration of the device 1 of the present invention. The device 1 of the present invention includes a memory cell array 21, a control circuit 22, a voltage generation circuit 23, a word line decoder 24, and a bit line decoder 25.

Figure 13:
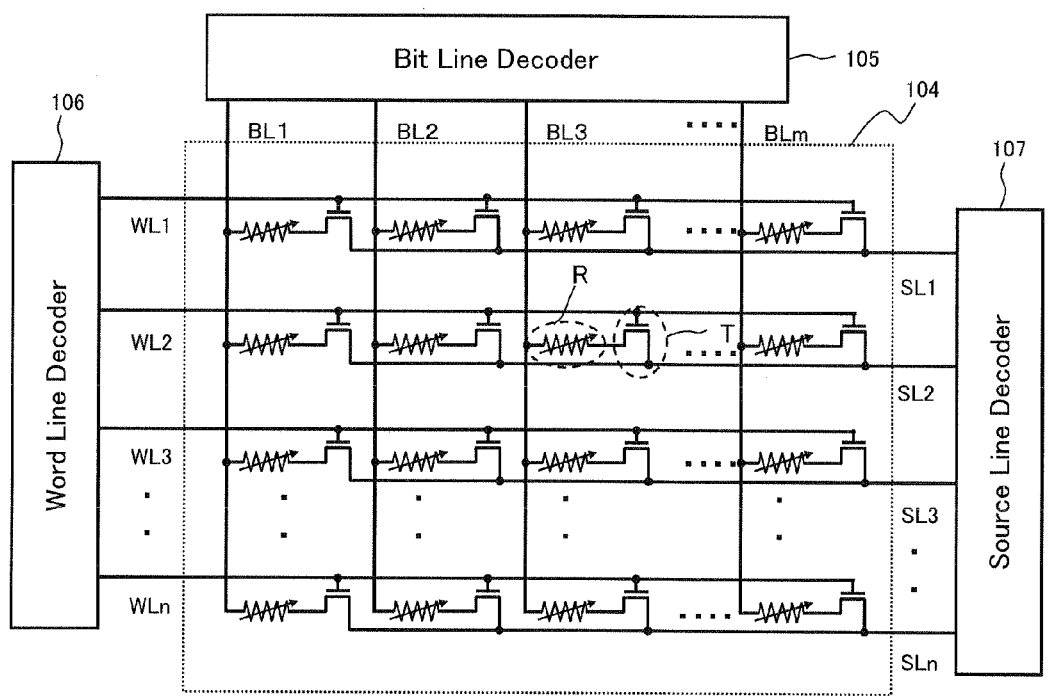
FIG. 13 is an equivalent circuit diagram showing one configuration example of a 1T1R type memory cell.
Figure 14:
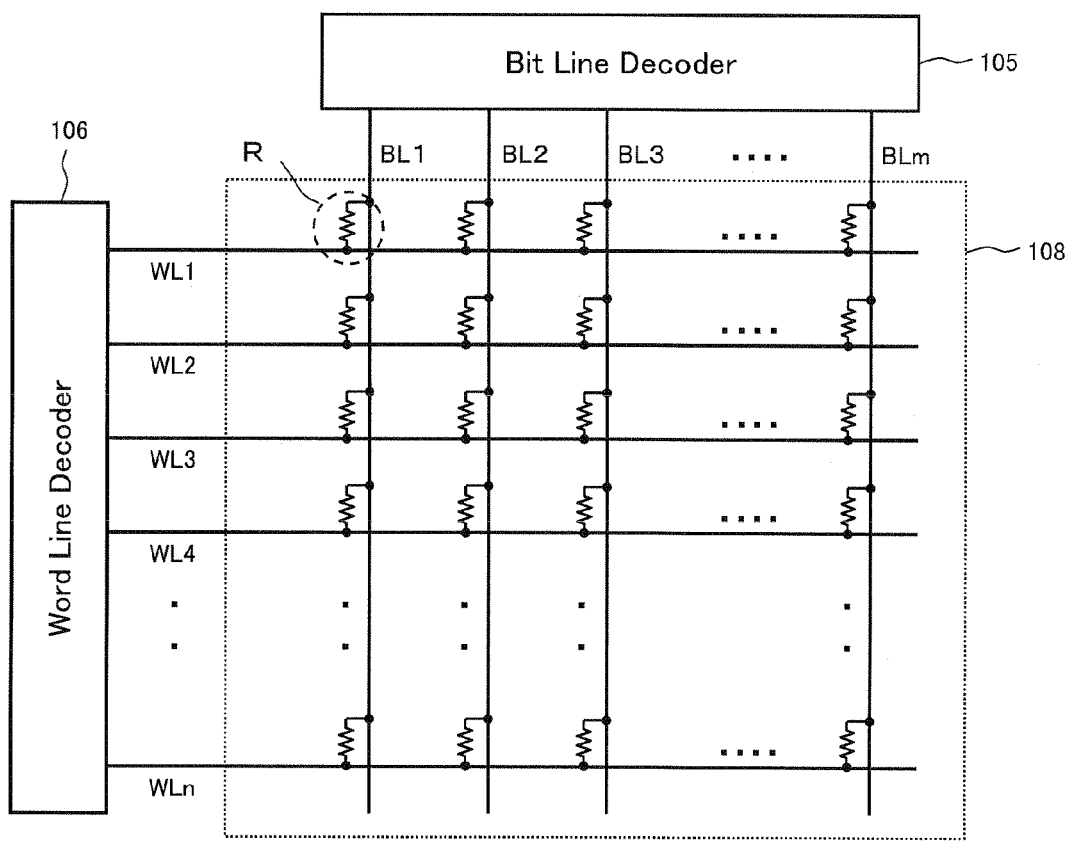
FIG. 14 is an equivalent circuit diagram showing one configuration example of a 1R type memory cell.

The memory cell array 21 is the memory cell array represented by the equivalent circuit diagram shown in FIG. 13 or 14, in which memory cells each including the variable resistive element 2 (any one of 2a to 2e) are arranged in a shape of a matrix in row and column directions, the memory cells belonging to the same column are connected by the bit line extending in the column direction, and the memory cells belonging to the same row are connected by the word line extending in the row direction, and when a selected word line voltage or an unselected word line voltage is applied to the word line, and a selected bit line voltage or an unselected bit line voltage is applied to the bit line, one or more memory cells, as an action target which has been designated by an external address input can be selected in each action such as programming, erasing, reading, and the forming process.

In addition, the memory cell array 21 may be any one of a memory cell array having a 1R structure which does not include a current limit element in a unit memory cell (refer to FIG. 14), a memory cell array having a 1D1R structure which includes a diode as a current limit element in a unit memory cell, and a memory cell array having a 1T1R structure which includes a transistor as a current limit element in a unit memory cell (refer to FIG. 13). According to the memory cell array having the 1D1R structure, one end of the diode is connected to one electrode of a variable resistive element in series, to compose the memory cell, and the other end of the diode or the other electrode of the variable resistive element is connected to the bit line or the word line. According to the memory cell array having the 1T1R structure, either a source or a drain of the transistor is connected to one electrode of the variable resistive element in series to compose the memory cell, and one of the other of the source or the drain of the transistor which is not connected to the variable resistive element, and the other electrode of the nonvolatile variable resistive element which is not connected to the transistor is connected to the bit line extending in the column direction, and the other thereof is connected to a common source line to supply the ground voltage, and gate terminals of the transistor are connected to the word line extending in the row direction.

The control circuit 22 controls each memory action in the memory cell array 21 of programming (set), erasing (reset), and reading actions, and controls the forming process. More specifically, the control circuit 22 controls the word line decoder 24 and the bit line decoder 25 based on an address signal inputted from an address line, a data input inputted from a data line, and a control input signal inputted from a control signal line, and controls each memory action of the memory cell and the forming process. In addition, although not shown in the example shown in FIG. 10, the control circuit 22 is provided with functions as a general address buffer circuit, data input/output buffer circuit, and a control input buffer circuit.

The voltage generation circuit 23 generates the selected word line voltage and the unselected word line voltage, supplies them to the word line decoder 24, generates the selected bit line voltage and the unselected bit line voltage, and supplies them to the bit line decoder 25 to select the memory cell of the action target, at the time of each memory action of programing (set), erasing (reset), and reading, and the forming process of the memory cell.

When the memory cell of the action target is inputted to the address line and designated, the word line decoder 24 selects the word line corresponding to the address signal inputted to this address line, and applies the selected word line voltage and the unselected word line voltage to the selected word line and the unselected word line, respectively, at the time of each memory action of programing (set), erasing (reset), and reading, and the forming process of the memory cell.

When the memory cell of the action target is inputted to the address line and designated, the bit line decoder 25 selects the bit line corresponding to the address signal inputted to this address line, and applies the selected bit line voltage and the unselected bit line voltage to the selected bit line and the unselected bit line, respectively, at the time of each memory action of programing (set), erasing (reset), and reading, and the forming process of the memory cell.

In addition, as for a detailed circuit configuration, a device structure, and a production method of each of the control circuit 22, the voltage generation circuit 23, the word line decoder 24, and the bit line decoder 25, since they can be realized with the well-known circuit configurations, and produced by the well-known semiconductor production techniques, their description is omitted.

Figure 11:
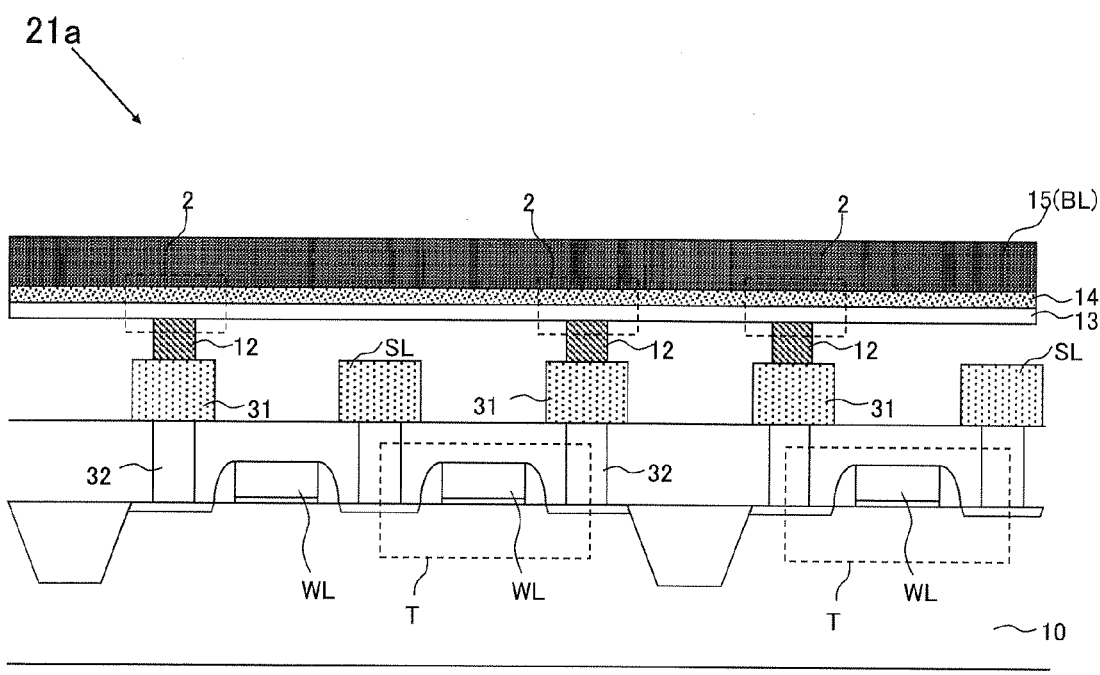
FIG. 11 is a cross-sectional view showing a schematic structure of a memory cell array including the variable resistive element according to the present invention.
Figure 12:
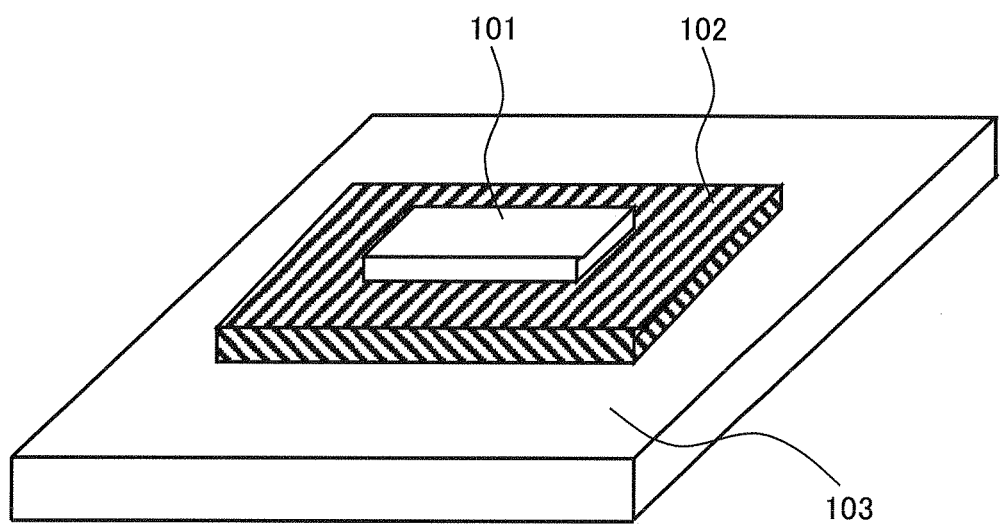
FIG. 12 is a schematic view showing an element structure of a conventional variable resistive element.

FIG. 11 shows a cross-sectional structure view of one example of the memory cell array 21 including the variable resistive elements 2 of the present invention. A memory cell array 21a shown in FIG. 11 is the memory cell array having the 1T1R structure in which the first electrode 15 extends in the column direction (lateral direction in FIG. 11) as the bit line BL, and the resistance change layer 13 and the control layer 14 also extend in the column direction. A contact plug connected to a transistor T formed in an lower layer through an island-shaped metal wiring 31 and a contact plug 32 serves as the second electrode 12 which is in contact with the resistance change layer 13. Thus, the variable resistive element 2 which includes the second electrode 12, the resistance change layer 13, the control layer 14, and the first electrode 15 is formed in a contact part (element formation region) between the second electrode 12 and the resistance change layer 13.

In addition, since the resistance change layer 13 which is in contact with the second electrode 12 extends in the column direction, it is physically in contact with the second electrode 12 of the adjacent variable resistive element 2, but as described above, since the transition metal oxide included in the resistance change layer 13 is an insulator when the film is formed, after the forming process has been performed by applying the voltage between the first electrode 12 and the second electrode 15 of the variable resistive element 2 which is in an initial high resistance state just after the film formation, its resistance is lowered, so that the memory action as the variable resistive element 2 can be performed. Therefore, the resistance change layer 13 positioned other than the element formation region is still in the high resistance state even after the forming process, so that there is no problem with a leak current.

In addition, it has been described that in the memory cell array having the 1T1R structure, the source line is shared by the all memory cells and the ground voltage is supplied thereto in the above embodiment, but the source line may extend in the column direction and connect memory cells belonging to the same column or extend in the row direction and connect the memory cells belonging to the same row. Furthermore, when a source line decoder 26 (not shown) which applies a selected source line voltage and an unselected source line voltage supplied from the voltage generation circuit 23 to source lines is further provided, the memory cell of the action target can be selected by designating the memory cell with respect to each row or column at the time of memory actions of programming (set), erasing (reset), and reading, and the forming process. When the memory cell of the action target is inputted to the address line and designated, the source line decoder 26 selects the source line corresponding to the address signal inputted to this address line, and applies the selected source line voltage and the unselected source line voltage to the selected source line and the unselected source line, respectively.

In addition, the illustration has been made of the case where the memory cell array is the cross-point type memory cell array having the 1D1R structure in which the diode is provided in the memory cell, or the cross-point type memory cell array having the 1T1R structure in which the transistor is provided in the memory cell, in the above embodiment, but the present invention is not limited to this configuration, and as long as the variable resistive element of the present invention having the metal oxide as the resistance change layer and further having the control layer is employed in the memory cell, the present invention can be applied to any memory cell array in which the above memory cells are arranged in a shape of matrix.

Furthermore, the illustration has been made of the case where the resistance change layer 13 is directly in contact with the second electrode 12 as the configuration of the variable resistive element 2, in the above embodiment, but the present invention is not limited to this. In order to provide a function as a nonlinear current limit element, a configuration may be provided such that a tunnel insulation film is inserted between the second electrode 12 and the resistance change layer 13, and in order to reduce an element variation of the filament path formed by the forming process, a configuration may be provided such that a buffer layer is inserted to prevent the current flowing between the electrodes of the variable resistive element from abruptly increasing after the completion of the forming process.

In addition, the illustration has been made of the element structure shown in FIG. 1 as the configuration of the variable resistive element 2 in the above embodiment, but the present invention is not limited to the element having the above structure.

Furthermore, the illustration has been made of the case where the resistance change layer (first metal oxide film) 13 and the control layer 14 include the oxide films of the different metals or films containing oxygen as the configuration of the variable resistive element 2 in the above embodiment, but they may be the oxide films of the same kind of metal or the films containing oxygen. In this case, in a method for producing the variable resistive element, the first metal oxide film serving as the oxide of the first metal is formed as the resistance change layer, the film of the first metal material is deposited on the first metal oxide film, oxygen in the first metal oxide film is moved to the side of the first metal material by application of heat and a forming voltage, whereby the control layer serving as the first metal oxide is formed. Therefore, each of the resistance change layer and the control layer is the first metal film containing oxygen, but its oxygen concentration is different from each other. The oxygen concentration distribution is provided such that while the concentration reduces from the resistance change layer on the side of the second electrode toward the control layer on the side of the first electrode across the boundary between the resistance change layer and the control layer, it shows a kink-shaped concentration distribution in which the concentration abruptly changes in the boundary between the resistance change layer and the control layer. In other words, a reduction rate of the oxygen concentration shows a maximum value in the vicinity of the boundary between the resistance change layer and the control layer.

The present invention can be applied to a nonvolatile semiconductor memory device, and particularly to a nonvolatile semiconductor memory device provided with a nonvolatile variable resistive element in which a resistance state is changed by voltage application, and the resistance state after changed is kept in a nonvolatile manner.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A variable resistive element comprising
a first metal oxide film which is an oxide film of a first metal and sandwiched between a first electrode and a second electrode, wherein
through a forming process, a resistance state between the first and second electrodes of the variable resistive element is changed from an initial high resistance state before the forming process to a variable resistance state,
the resistance state in the variable resistance state is changed between two or more different resistance states by applying an electric stress between the first electrode and the second electrode of the variable resistive element in the variable resistance state, and one resistance state after the change is used for storing information,
a control layer containing oxygen is inserted between the first electrode and the first metal oxide film, and formed of a second metal capable of extracting oxygen from the first metal oxide film to prevent oxygen from being thermally diffused from the first metal oxide film to the first electrode,
the second metal included in the control layer is different from the first metal, or same as the first metal,
when the second metal is same as the first metal, a concentration distribution is provided in such a manner that an oxygen concentration of the control layer and the first metal oxide film becomes lower from the first metal oxide film toward the control layer across a boundary between the first metal oxide film and the control layer, oxide formation free energy of at least one element included in the control layer except for oxygen is lower than oxide formation free energy of an element included in the first electrode, and
both work functions of the second metal and the first electrode are 4.5 eV or less.

2. The variable resistive element according to claim 1, wherein
a concentration distribution is provided in such a manner that an oxygen concentration of the control layer becomes lower from a side of the first metal oxide film toward a side of the first electrode.

3. The variable resistive element according to claim 1, wherein
a concentration distribution is provided in such a manner that an oxygen concentration of the first metal oxide film becomes lower from a side of the second electrode toward a side of the control layer.

4. The variable resistive element according to claim 1, wherein
the first metal oxide film comprises an n-type metal oxide.

5. The variable resistive element according to claim 4, wherein
the first metal oxide film comprises an oxide of any one of elements of Hf, Zr, Ti, Ta, V, Nb, and W, or a strontium titanate.

6. The variable resistive element according to claim 1, wherein
the second metal comprises any one of elements of Ti, V, Al, Hf, and Zr.

7. The variable resistive element according to claim 1, wherein
a work function of the second electrode is 4.5 eV or more.

8. The variable resistive element according to claim 7, wherein
the second electrode comprises a Ti nitride.

9. The variable resistive element according to claim 1, wherein
the control layer is thinner than the first electrode.

10. The variable resistive element according to claim 9, wherein
a film thickness of the control layer is 20 nm or less.

11. A method for producing the variable resistive element according to claim 1, comprising:
depositing a second electrode material on a substrate, and forming the second electrode;
depositing a first metal oxide film material, a second metal material, and a first electrode material in this order;
forming the first metal oxide film and the first electrode by patterning the first metal oxide film material, the second metal material, and the first electrode material with a common resist mask;
performing a heat treatment; and
applying a forming voltage between the first electrode and the second electrode to perform a forming process, whereby oxygen in the first metal oxide film being partially moved toward the second metal material, the second metal material being changed into the control layer, a resistance state of the variable resistive element being changed from the initial high resistance state to the variable resistance state.

12. A nonvolatile semiconductor memory device comprising a memory cell array having the variable resistive elements according to claim 1, the variable resistive elements being arranged in at least a column direction of a row direction and the column direction.

13. The nonvolatile semiconductor memory device according to claim 12, wherein
   the memory cell array is provided in such a manner that
   the first electrode extends in the column direction to connect the variable resistive elements adjacent in the column direction, and
   the control layer extends in the column direction.

* * * * *